US007608500B2

(12) United States Patent
You et al.

(10) Patent No.: US 7,608,500 B2
(45) Date of Patent: Oct. 27, 2009

(54) METHOD OF FORMING SEMICONDUCTOR DEVICE INCLUDEING FORMING CONTROL GATE LAYER OVER EACH REGION AND REMOVING A PORTION OF THE TUNNEL INSULATING LAYER ON THE LOW VOLTAGE REGION

(75) Inventors: Byung-Kwan You, Gyeonggi-do (KR); Jun-Eui Song, Gyeonggi-do (KR); Gyeong-Hee Kim, Gyeonggi-do (KR); Hee-Jueng Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 333 days.

(21) Appl. No.: 11/671,994

(22) Filed: Feb. 6, 2007

(65) Prior Publication Data
US 2007/0184606 A1 Aug. 9, 2007

(30) Foreign Application Priority Data
Feb. 7, 2006 (KR) ...................... 10-2006-0011846

(51) Int. Cl.
*H01L 21/8238* (2006.01)
*H01L 21/8234* (2006.01)
(52) U.S. Cl. ...................................... 438/211; 438/275
(58) Field of Classification Search ................. 438/211, 438/275; 257/E21.66, E21.678, E21.683, 257/E21.691
See application file for complete search history.

(56) References Cited
U.S. PATENT DOCUMENTS
6,281,050 B1   8/2001   Sakagami 2007/0241386 A1* 10/2007 Wang et al. .................. 257/314

FOREIGN PATENT DOCUMENTS

| JP | 2000-269466 | 9/2000 |
|----|-------------|--------|
| JP | 2005-159361 | 6/2005 |
| KR | 10-2001-0027375 | 4/2001 |
| KR | 2002-0056355 | 7/2002 |
| KR | 2003-0092997 | 12/2003 |
| KR | 10-2004-0005477 | 1/2004 |

OTHER PUBLICATIONS

English language abstract of Korean Publication No. 2002-0056355.
English language abstract of Korean Publication No. 2003-0092997.
English language abstract of Japanese Publication No. 2000-269466.

* cited by examiner

*Primary Examiner*—William M. Brewster
(74) *Attorney, Agent, or Firm*—Marger Johnson & McCollom, P.C.

(57) ABSTRACT

Provided is a method of forming a semiconductor device. A tunnel insulating layer is formed on a substrate having a cell region and a low voltage region. First and second charge storage gate patterns (e.g., floating gate patterns) are formed on the tunnel insulating layers of the cell and low voltage region, respectively. A blocking insulating layer and a control gate conductive layer are formed on the substrate in sequence. The control gate conductive layer, the blocking insulating layer, the second floating gate pattern and the tunnel insulating layer of the low voltage region are removed to expose the substrate of the low voltage region. The low-voltage gate insulating layer is formed on the exposed substrate. A low-voltage gate conductive pattern is formed on the low-voltage gate insulating layer.

23 Claims, 12 Drawing Sheets

METHOD OF FORMING SEMICONDUCTOR DEVICE INCLUDEING FORMING CONTROL GATE LAYER OVER EACH REGION AND REMOVING A PORTION OF THE TUNNEL INSULATING LAYER ON THE LOW VOLTAGE REGION

CROSS-REFERENCE TO RELATED APPLICATIONS

This patent application claims the benefit of foreign priority to Korean Patent Application No. 10-2006-11846, filed on Feb. 7, 2006, the entire contents of which are hereby incorporated by reference.

BACKGROUND

1. Field of Invention

Embodiments exemplarily described herein generally relate to methods of forming semiconductor devices and, more particularly, to a method of forming a semiconductor device in which gate insulating layers with different thicknesses are required.

2. Description of the Related Art

Semiconductor devices such as nonvolatile memory devices have a characteristic that it retains stored data even if power supply is interrupted. Currently, a flash memory device having a floating gate is a representative nonvolatile memory device which has been most well-known. In the flash memory device, according to whether or not charges are stored in the floating gate which is electrically isolated, a flash memory cell stores data of logic value "1" or "0".

Typically, the flash memory device includes a cell region and a peripheral circuit region.

The peripheral circuit region includes a high voltage region where a high-voltage transistor is formed, and a low voltage region where a low-voltage transistor is formed. It may be required that gate oxide layers formed in these regions should be formed with different thicknesses to satisfy the characteristics of the respective regions.

It is known that thin gate oxide layers having the same thickness are formed in both the cell region and the low voltage region but a thick gate oxide layer is formed in the high voltage region. A flash memory device is conventionally formed by forming a thick gate oxide layer over an entire surface of a semiconductor substrate. Thereafter, the thick gate oxide layer over the cell and low voltage regions is removed using a photoresist pattern. Subsequently, a thin gate oxide layer is formed again over the cell and low voltage regions. Afterwards, a doped polysilicon layer is formed on the semiconductor substrate. Finally, a floating gate of the cell region, a gate electrode of the low voltage region, and a gate electrode of the high voltage region are formed from the doped polysilicon layer.

However, as the flash memory device has various characteristics and it becomes highly integrated, it may be difficult to reliably form different elements such as the flash memory cell, the low voltage transistor and the high voltage transistor, using the conventional method described above. For example, the photoresist layer is generally used for selectively removing the thick gate oxide layer of the cell and low voltage regions. Consequently, the thick gate oxide layer of the high voltage transistor can become contaminated with organic materials. Other problems may also be encountered during conventional processing. Therefore, a method capable of achieving various characteristics of the elements performing different functions is increasingly in demand.

SUMMARY

Embodiments exemplarily described herein provide a method of forming a semiconductor device capable of optimizing various characteristics of elements performing different functions.

One embodiment exemplarily described herein can be characterized as a method of forming a semiconductor device. In the method, a substrate having a cell region and a low voltage region is prepared. A tunnel insulating layer is formed on the cell and low voltage regions. A first charge storage gate pattern and a second charge storage gate pattern are formed on portions of the tunnel insulating layer on the cell and low voltage regions, respectively. A blocking insulating layer and a control gate conductive layer are formed on each of the first and second charge storage gate patterns. A portion of the control gate conductive layer and a portion of the blocking insulating layer on the second charge storage gate pattern are removed and the second charge storage gate pattern and the portion of the tunnel insulating layer on the low voltage region are also removed, thereby exposing the low voltage region. A low-voltage gate insulating layer is formed on the exposed portion of the low voltage region. A low-voltage gate conductive pattern is formed on the low-voltage gate insulating layer.

Another embodiment exemplarily described herein can be characterized as a method of forming a semiconductor device. In the method, a substrate including a cell region, a low voltage region and a high voltage region is prepared. A high-voltage gate insulating layer is formed on the high voltage region. A tunnel insulating layer is formed on the cell and low voltage regions. A first charge storage gate pattern, a second charge storage gate pattern and a third charge storage gate pattern are formed on a portion of the tunnel insulating layer on the cell region, on a portion of the tunnel insulating layer on the low voltage region and on the high-voltage gate insulating layer, respectively. A blocking insulating layer and a control gate conductive layer are formed on each of the first, second and third charge storage gate patterns. Portions of the control gate conductive layer and portions of the blocking insulating layer on the low and high voltage regions are removed with respect to portions of the control gate conductive layer and the blocking insulating layer on the cell region. The second charge storage gate pattern and the portion of the tunnel insulating layer on the low voltage region is removed, thereby exposing a portion of the low voltage region. A low voltage gate insulating layer is formed on the exposed portion of the low voltage region. A low-voltage gate conductive pattern is formed on the low-voltage gate insulating layer.

Yet another embodiment exemplarily described herein can be characterized as a method of forming a semiconductor device. In the method, a substrate including a cell region, a low voltage region, a high voltage region and a resistor region is prepared. A high-voltage gate insulating layer is formed on the high voltage region. A tunnel insulating layer is formed on the cell and low voltage regions. A first charge storage gate pattern, a second charge storage gate pattern and a third charge storage gate pattern are formed on a portion of the tunnel insulating layer on the cell region, on a portion of the tunnel insulating layer on the low voltage region and on the high-voltage gate insulating layer, respectively. A blocking insulating layer and a control gate conductive layer are formed on each of the first, second and third charge storage gate patterns and on the resistor region. Portions of the control gate conductive layer and the blocking insulating layer on the low and high voltage regions are selectively removed with respect to portions of the control gate conductive layer and the blocking insulating layer on the cell region. The second charge storage gate pattern and the portion of the tunnel insulating layer on the low voltage region are removed, thereby exposing the low voltage region. A low voltage gate insulating layer is formed on the exposed portion of the low voltage region. A low-voltage gate conductive pattern is formed on the low-voltage gate insulating layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
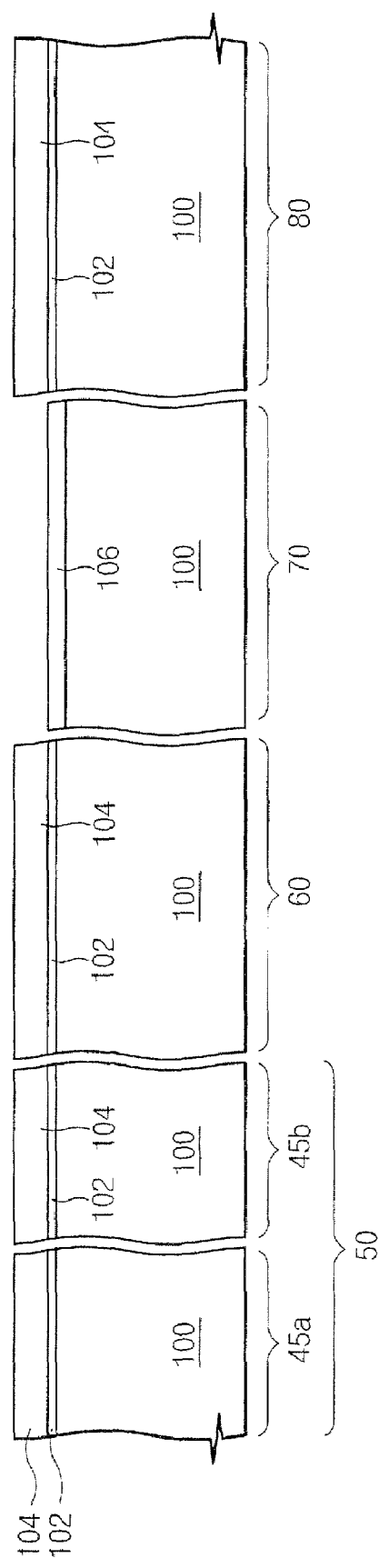
FIGS. 1 through 12 are cross-sectional views illustrating an exemplary embodiment of a method of forming a semiconductor device.

Exemplary embodiments of the present invention will be described below in more detail with reference to the accompanying drawings. These embodiments may, however, be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

FIGS. 1 through 12 are cross-sectional views illustrating an exemplary embodiment of a method of forming a semiconductor device (e.g., including a nonvolatile memory device). In FIGS. 1 through 12, reference numeral "45*a*" denotes a cross-sectional view taken along a channel width of a nonvolatile memory cell, and reference numeral "45*b*" denotes a cross-sectional view taken along a channel length of the nonvolatile memory cell.

Referring to FIG. 1, a buffer insulating layer 102 and an anti-oxidation layer 104 are sequentially formed on a semiconductor substrate 100 (hereinafter, referred to as a substrate) having a first region 50, a second region 60, a third region 70 and a fourth region 80. The first region 50 is a region where a nonvolatile memory cell is formed and the second region is a region where a low-voltage transistor is formed. The third region 70 is a region where a high-voltage transistor is formed and the fourth region 80 is a region where a resistor is formed. Throughout the detailed description of the preferred embodiment, the first, second, third and fourth regions 50, 60, 70 and 80 are designated as a cell region 50, a low voltage region 60, a high voltage region 60, and a resistor region, respectively.

The substrate 100 may include a silicon substrate. The anti-oxidation layer 104 may, for example, include a material having excellent anti-oxidative property (e.g., silicon nitride). The buffer insulating layer 102 may play a role in buffering the stress between the anti-oxidation layer 104 and the substrate 100. For instance, the buffer insulating layer 102 may include silicon oxide.

The anti-oxidation layer 104 and the buffer insulating layer 102 are selectively removed to expose a portion of the substrate 100 at the high voltage region 70. Portions of the substrate 100 at the cell, low voltage and resistor regions 50, 60 and 80 are covered with the anti-oxidation layer 104.

A high-voltage gate insulating layer 106 is formed on the exposed substrate 100 at the high voltage region 70. The high-voltage gate insulating layer 106 is formed sufficiently thickly such that it can endure high operational voltage. In particular, the high-voltage gate insulating layer 106 may be thicker than the buffer insulating layer 102. The high-voltage gate insulating layer 106 may be formed according to, for example, a thermal oxidation process. Due to the anti-oxidation layer 104, the high-voltage gate insulating layer 106 is not formed on the substrate 100 at the cell, low voltage and resistor regions 50, 60 and 80.

Figure 2:
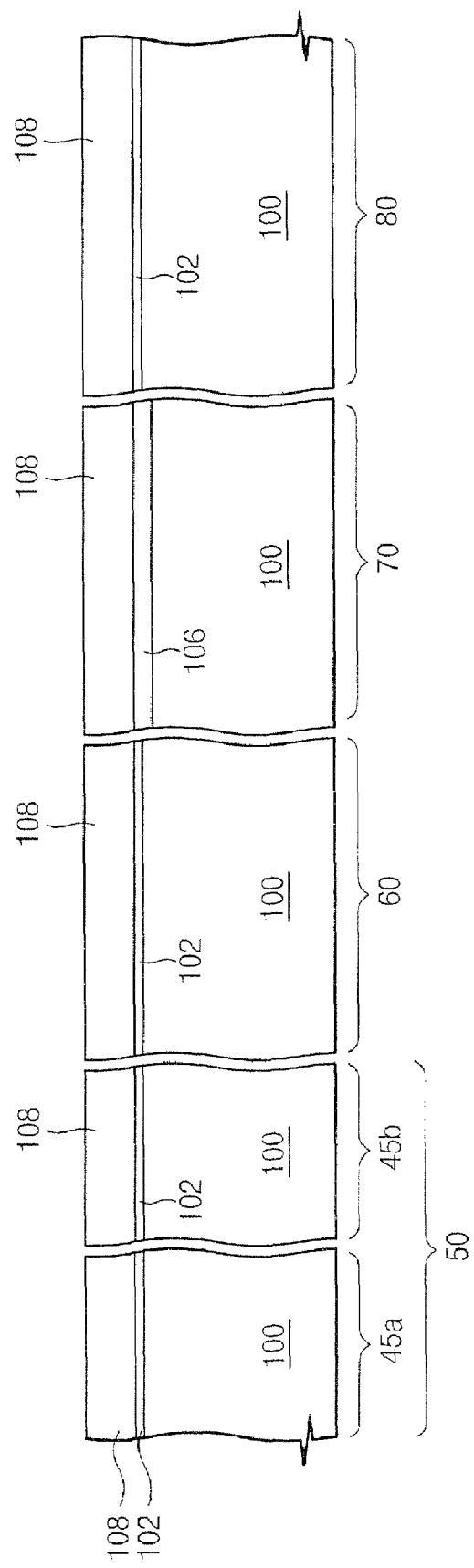

Referring to FIG. 2, the anti-oxidation layer 104 is removed from the substrate 100 having the high-voltage gate insulating layer 106. Accordingly, the buffer insulating layer 102 is exposed at the cell, low voltage and resistor regions 50, 60 and 80.

Thereafter, a hard mask layer 108 is formed over substantially the entire surface of the substrate 100. The hard mask layer 108 is formed of a material having an etch selectivity with respect to the substrate 100. The hard mask layer 108 may include inorganic material. For example, the hard mask layer 108 may include silicon nitride. The buffer insulating layer 102 and the high-voltage gate insulating layer 106 are interposed between the hard mask layer 108 and the substrate 100.

Figure 3:
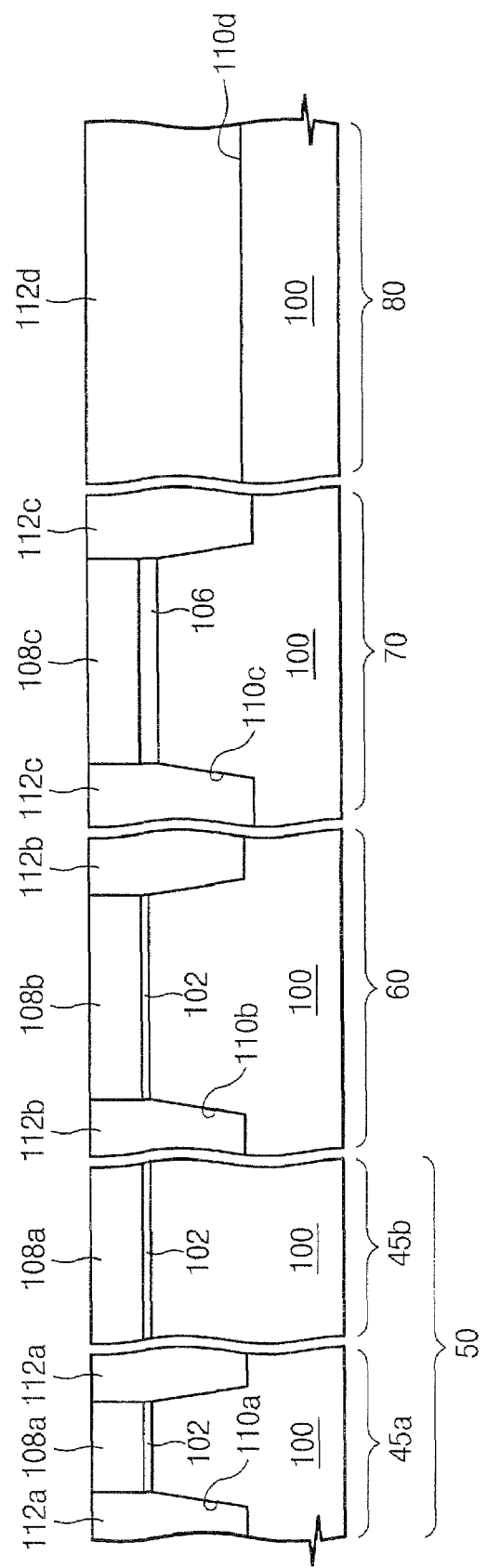

Referring to FIG. 3, the hard mask layer 108, the buffer insulating layer 102 and the substrate 100 at the cell region 50 are sequentially patterned to form a first trench 110*a* defining a first active region in the cell region 50. Likewise, the hard mask layer 108, the buffer insulating layer 102 and the substrate 100 at the low voltage region 60 are sequentially patterned to form a second trench 110*b* defining a second active region in the low voltage region 60. In addition, the hard mask layer 108, the buffer insulating layer 102 and the substrate 100 at the high voltage region 70 are sequentially patterned to form a third trench 110*c* defining a third active region in the high voltage region 70. The hard mask layer 108, the buffer insulating layer 102 and the substrate 100 of the resistor region 80 are patterned in sequence to form a fourth trench 110*d* defining a fourth active region in the resistor region 80. In the illustrated embodiment, the fourth trench may be formed within a large portion of the resistor region 80. In the illustrated embodiment, the fourth trench may be formed within substantially the entire resistor region 80. In FIG. 3, the cross-section of the resistor region 80 shows that the cross section of the region where the fourth trench is formed. The fourth trench may be formed simultaneously with the first, second and third trenches 110*a*, 110*b* and 110*c*.

A first hard mask pattern 108*a* is disposed over the first active region, wherein the buffer insulating layer 102 is interposed between the first hard mask pattern 108*a* and the substrate 100. Likewise, a second hard mask pattern 108*b* is disposed over the second active region, wherein the buffer insulating layer 102 is interposed between the second hard mask pattern 108*b* and the substrate 100. Similarly, a third hard mask pattern 108c is disposed over the third active region, wherein the high-voltage gate insulating layer 106 is interposed between the third hard mask pattern 108c and the substrate 100.

A device isolation layer is formed over substantially the entire surface of the substrate 100 such that it fills the first, second, third and fourth trenches 110a, 110b, 110c and 110d. The device isolation layer is planarized until the hard mask patterns 108a, 108b and 108c are exposed, thereby forming first, second, third and fourth device isolation patterns 112a, 112b, 112c and 112d. As illustrated, the first device isolation pattern 112a fills the first trench 110a of the cell region 50, the second device isolation pattern 112b fills the second trench 110b of the low voltage region 60, the third device isolation pattern 112c fills the third trench 110c of the high voltage region 70, and the fourth device isolation pattern 112d fills the fourth trench 110d of the resistor region 80.

The device isolation patterns 112a, 112b, 112c and 112d may include a material such as silicon oxide. In one embodiment, the device isolation patterns 112a, 112b, 112c and 112d may include a material such as undoped silicate glass or high-density plasma (HDP) silicon oxide, or the like. Before forming the device isolation layer, a thermal oxidation process may be performed to heal damage imparted to bottom surfaces and sidewalls of the first, second, third and fourth trenches 110a, 110b, 110c and 110d and the fourth trench caused during an etching process.

Figure 4:
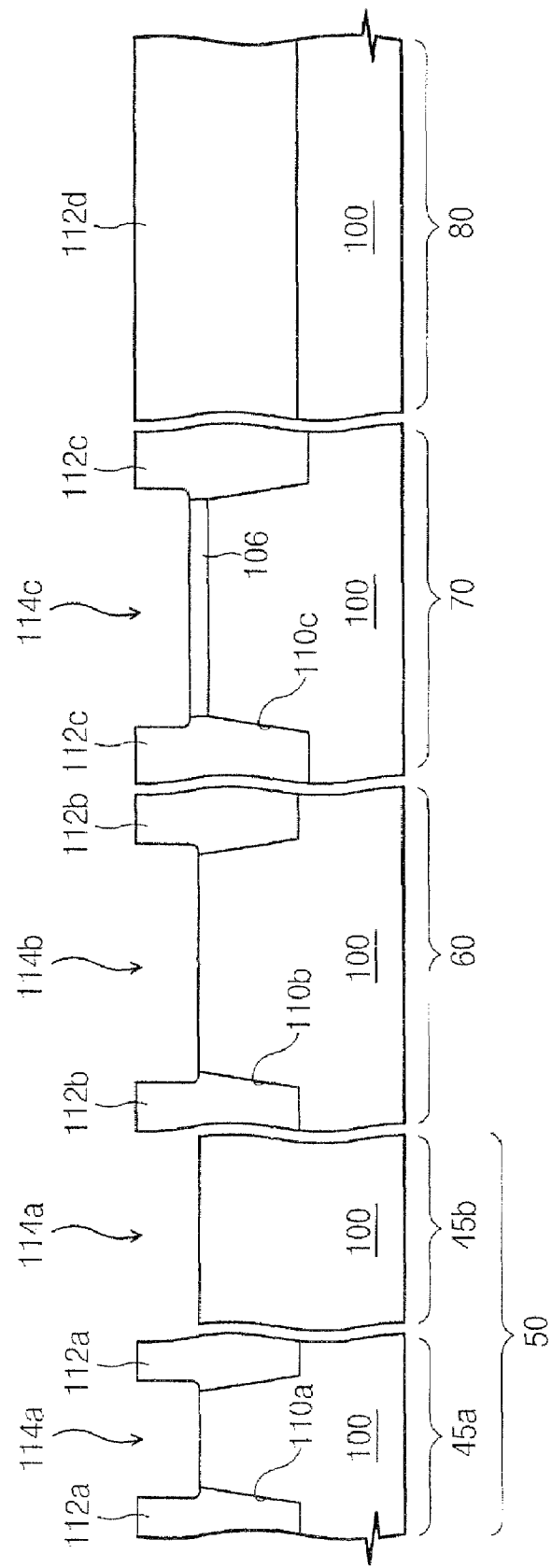

Referring to FIG. 4, the first, second and third hard mask patterns 108a, 108b and 108c, and the buffer insulating layer 102 are sequentially removed. Accordingly, a first cavity region 114a is formed to expose the first active region in the cell region 50 and a second cavity region 114b is formed to expose the second active region in the low voltage region 60. Likewise, a third cavity region 114c is formed to expose the high-voltage gate insulating layer 106 in the high voltage region 70. In one embodiment, the first, second and third hard mask patterns 108a, 108b and 108c, and the buffer insulating layer 102, may be removed through an isotropic etching process (e.g., a wet etching process).

While the buffer insulating layer 102 is removed, portions of the device isolation patterns 112a, 112b, 112c, and 112d may also be removed. Accordingly, the widths of the first, second and third cavity regions 114a, 114b and 114c may become greater than those of the first, second and third active regions. In addition, while the buffer insulating layer 102 is removed, a portion of the high-voltage gate insulating layer 106 may also be removed (e.g., recessed). Therefore, the high-voltage gate insulating layer 106 may initially be formed thicker than a target thickness based upon an anticipated amount that it will be slightly recessed while removing the buffer insulating layer 102.

Figure 5:
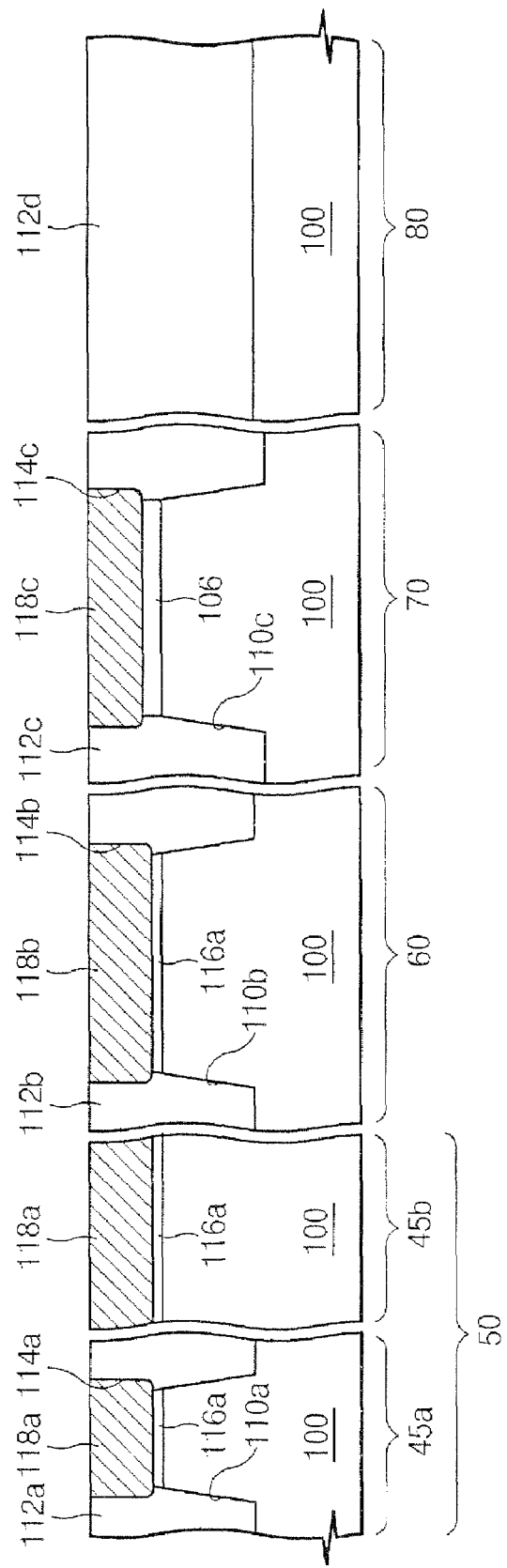

Referring to FIG. 5, a tunnel insulating layer 116a is formed on portions of the substrate 100 exposed by the first and second cavity regions 114a and 114b and a charge storage layer (e.g., a floating gate layer) is then formed on substantially the entire surface of the substrate 100 such that it fills the first, second and third cavity regions 114a, 114b and 114c. Subsequently, the floating gate layer is planarized until the device isolation patterns 112a, 112b, 112c, and 112d are exposed, thereby forming a first charge storage gate pattern 118a (e.g., a first floating gate pattern 118a), a second charge storage gate pattern 118b (e.g., a second floating gate pattern 118b) and a third charge storage gate pattern 118c (e.g., a third floating gate pattern 118c). In the illustrated embodiment, the first, second and third floating gate patterns 118a, 118b and 118c fill the first, second and third cavity regions 114a, 114b and 114c, respectively.

The tunnel insulating layer 116a may include a material such as silicon oxide. In one embodiment, the tunnel insulating layer 116a may be formed according to, for example, a thermal oxidation process. In another embodiment, the tunnel insulating layer 116a may be thinner than the high-voltage gate insulating layer 106 interposed between the third floating gate pattern 118c and the third active region. The floating gate patterns 118a, 118b and 118c may include a material such as doped polysilicon.

Figure 6:
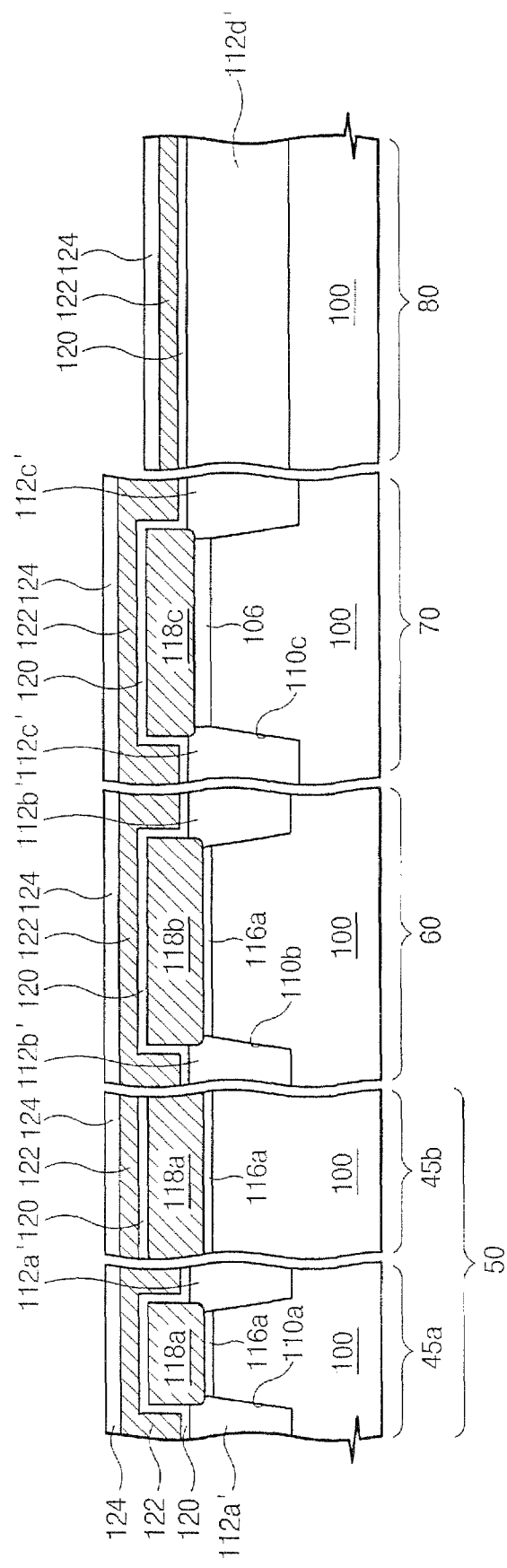

Referring to FIG. 6, the first, second, third and fourth device isolation patterns 112a, 112b, 112c and 112d are recessed to expose the side surfaces of the first, second and third floating gate patterns 118a, 118b and 118c, thereby forming first, second, third and fourth recessed device isolation patterns 112a', 112b', 112c' and 112d'. In the illustrated embodiment, the first recessed device isolation pattern 112a' covers the side surface of the tunnel insulating layer 116a of the cell region 50. Likewise, the third recessed device isolation pattern 112c' may cover the side surface of the high-voltage gate insulating layer 106. In the illustrated embodiment, the top surfaces of the first, second, third and fourth recessed device isolation patterns 112a', 112b', 112c', and 112a' may be substantially identical in height. In another embodiment, however, the top surface of the fourth recessed device isolation pattern 112d' has a relatively large planar region and may have a height that is lower than the top surface of, for example, the first recessed device isolation pattern 112a'.

A blocking insulating layer 120 is conformally formed on substantially the entire surface of the substrate 100. The blocking insulating layer 120 conformally covers the exposed side surface and top surface of the first, second and third floating gate patterns 118a, 118b and 118c. Likewise, the blocking insulating layer 120 conformally covers the fourth recessed device isolation pattern 112d'. A control gate conductive layer 122 is formed on the blocking insulating layer 120. In one embodiment, an etch stop layer 124 may be formed on the control gate conductive layer 122.

The blocking insulating layer 120 may be formed of oxide-nitride-oxide (ONO) layer. Alternatively, the blocking insulating layer 120 may include a dielectric layer formed of a material such as a metal oxide (e.g., hafnium oxide, aluminum oxide layer, or the like) having a dielectric constant higher than the tunnel insulating layer 116a. The control gate conductive layer 122 includes a conductive material. In one embodiment, the conductive material from which the control gate conductive layer 122 is formed may be used as material in a resistor. For example, the control gate conductive layer 122 may include a material such as doped polysilicon. The etch stop layer 124 may include a material having an etch selectivity with respect to the control gate conductive layer 122.

Figure 7:
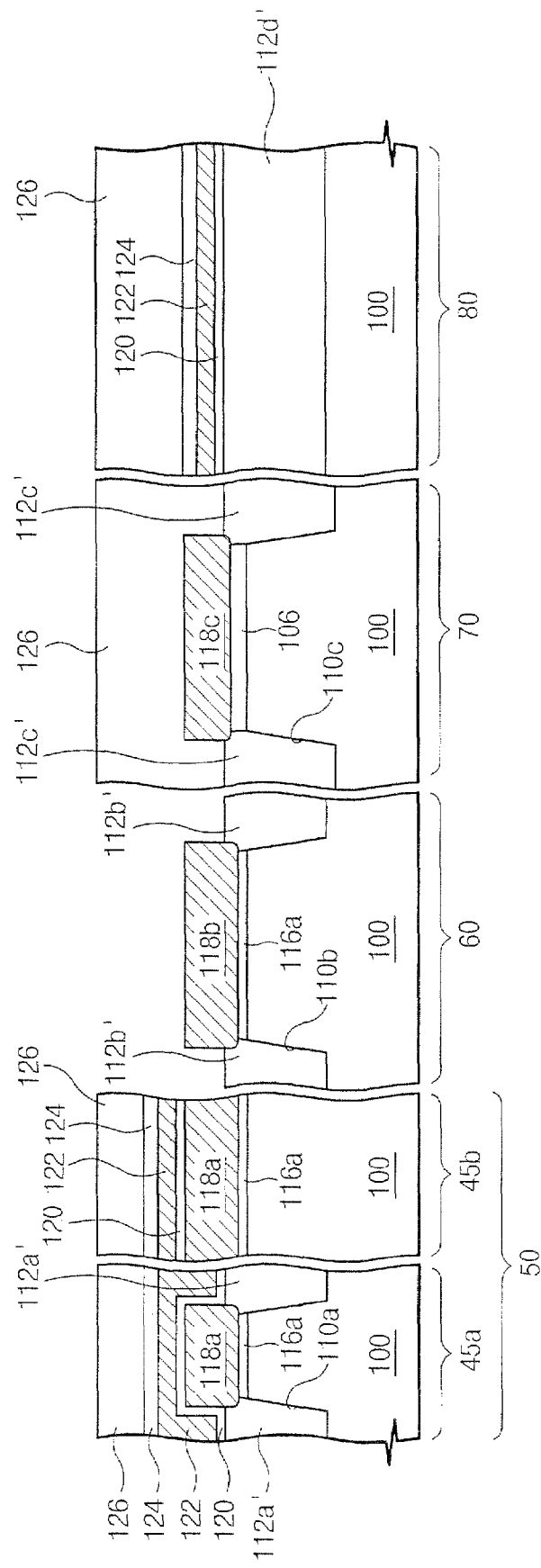

Referring to FIG. 7, portions of the etch stop layer 124, the control gate conductive layer 122 and the blocking insulating layer 120 formed over both the low and high voltage regions 60 and 70 are removed to expose the second and third floating gate patterns 118b and 118c, respectively. At this time, the etch stop layer 124, the control gate conductive layer 122 and the blocking insulating layer 120 formed over the cell and resistor regions 50 and 80 remain.

When fabricating semiconductor devices such as NAND-type nonvolatile memory devices that incorporate string select and ground select transistors, portions of the etch stop layer 124, the control gate conductive layer 122 and the blocking insulating layer 120 can be removed at the region where select gate electrodes of the select transistors are formed. Accordingly, the blocking insulating layer 120 may prevent subsequently formed select gate electrodes from being electrically insulated from each other.

After portions of the etch stop layer 124, the control gate conductive layer 122 and the blocking insulating layer 120 formed over both the low and high voltage regions 60 and 70 are removed, a mask pattern 126 is formed on the substrate 100. In one embodiment, the mask pattern 126 includes a photoresist pattern. As illustrated, the mask pattern 126 covers the cell region 50, the high voltage region 70 and the resistor region 80 and exposes the second floating gate pattern 118b of the low voltage region 60.

Figure 8:
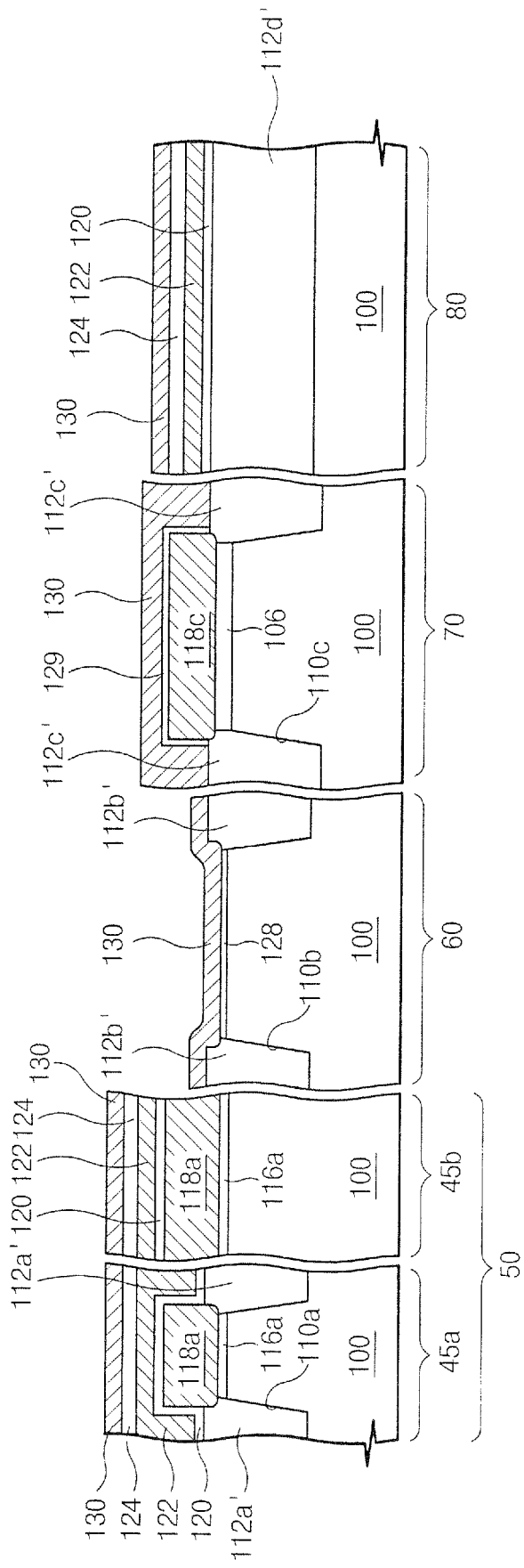

Referring to FIG. 8, the exposed second floating gate pattern 118b and the tunnel insulating layer 116a under the second floating gate pattern 118b are removed using the mask pattern 126 as a mask. Therefore, the portion of the substrate 100 at the low voltage region 60 (i.e., the second active region) is exposed. Afterwards, the mask pattern 126 is removed.

Subsequently, a low-voltage gate insulating layer 128 is formed on the exposed second active region and a low-voltage gate conductive layer 130 is formed on substantially the entire surface of the substrate 100. Accordingly, the low-voltage gate insulating layer 128 is formed independently of the high-voltage gate insulating layer 106 and the tunnel insulating layer 116a of the cell region. Thus, the low-voltage gate insulating layer 128 may be formed to any desired thickness that the low-voltage transistor requires. The low-voltage gate insulating layer 128 may be formed thinner than the tunnel insulating layer 116a. Therefore, it is possible to provide a low-voltage transistor having high-speed performance. Of course, the low-voltage gate insulating layer 128 is formed thinner than the high-voltage gate insulating layer 106 disposed under the third floating gate pattern 118c. In one embodiment, the low-voltage gate insulating layer 128 may be formed according to, for example, a thermal oxidation process. Accordingly, a surface oxide layer 129 may be formed on the surface of the third floating gate pattern 118c during formation of the low-voltage gate insulating layer 128.

A low-voltage gate conductive layer 130 over the substrate 100 within the cell region 50, the low voltage region 60, the high voltage region 70 and the resistor region 80. Accordingly, the low-voltage gate conductive layer 130 may be formed on the low-voltage gate insulating layer 128 and on the surface oxide layer 129. In one embodiment, the low-voltage gate conductive layer 130 includes a conductive material capable of forming a stable interface with the low-voltage gate insulating layer 128. For example, the low-voltage gate conductive layer 130 may include a material such as doped polysilicon. In one embodiment, the etch stop layer 124 may include a material that additionally has an etch selectivity with respect to the low-voltage gate conductive layer 130. For example, the etch stop layer 124 may include a material such as silicon oxide. Since the etch stop layer 124 is formed on the control gate conductive layer 122 in the cell and resistor regions 50 and 80, the surface oxide layer 129 is not formed on the control gate conductive layer 122 of the cell and resistor regions 50 and 80.

Figure 9:
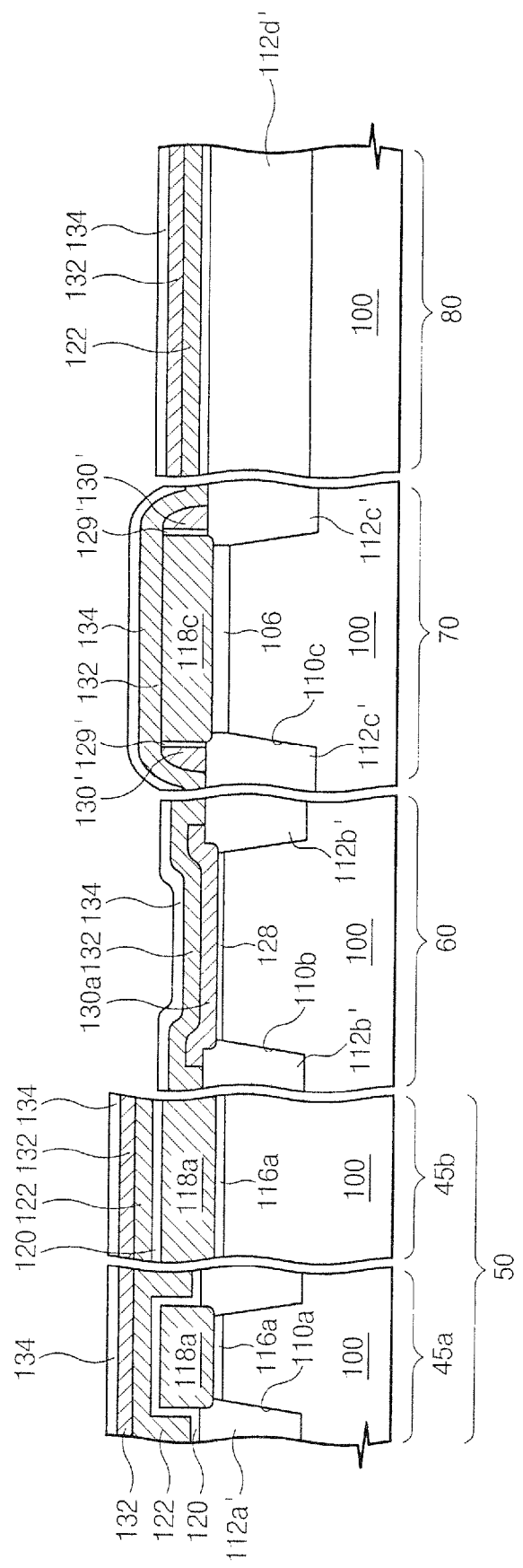

Referring to FIG. 9, the low-voltage gate conductive layer 130 is patterned to form a low-voltage gate conductive pattern 130a in the low voltage region 60. In one embodiment, portions of the low-voltage gate conductive layer 130 within the cell and resistor regions 50 and 80 are removed so that the etch stop layer 124 is exposed in the cell and resistor regions 50 and 80. In another embodiment, a portion of the low-voltage gate conductive layer 130 disposed over the third floating gate pattern 118c in the high voltage region 70 is removed to expose the surface oxide layer 129 formed on the top surface of the third floating gate pattern 118c.

In one embodiment, the low-voltage gate conductive layer 130 is patterned through an anisotropic etching process. In such an embodiment, spacers 130' formed from the low-voltage gate conductive layer 130 may be formed on the sidewalls of the third floating gate pattern 118c. In another embodiment, the low-voltage gate conductive layer 130 is patterned through an isotropic etching process. In such an embodiment, the low-voltage gate conductive layer 130 within the high voltage region 70 may be completely removed.

Subsequently, portions of the exposed etch stop layer 124 within the cell and resistor regions 50 and 80 are removed to expose the control gate conductive layer 122 in the cell and resistor regions 50 and 80. The exposed surface oxide layer 129 within the high voltage region 70 is also removed, thereby exposing at least the top surface of the third floating gate pattern 118c. In one embodiment, the surface oxide layer 129 is removed through an anisotropic etching process. In such an embodiment, spacers 129' of the surface oxide layer 129 may be formed on the sidewalls of the third floating gate pattern 118c. In another embodiment, the surface oxide layer 129 is removed through an isotropic etching process. In such an embodiment, the surface oxide layer 129 is completely removed, thereby exposing the top surface and sidewalls of the third floating gate pattern 118c.

In one embodiment, the etch stop layer 124 and the surface oxide layer 129 may be removed simultaneously (e.g., in the same etching process).

Thereafter, an auxiliary gate conductive layer 132 is formed on substantially the entire surface of the substrate 100. The auxiliary gate conductive layer 132 contacts the control gate conductive layer 122 of the cell and resistor regions 50 and 80, the low-voltage gate conductive pattern 130a and at least the top surface of the third floating gate pattern 118c of the high voltage region 70. In one embodiment, the auxiliary gate conductive layer 132 includes a material that may be used as a resistor. For example, the auxiliary gate conductive layer 132 may include a material such as doped polysilicon.

The auxiliary gate conductive layer 132 may prevent metals in a subsequently formed low resistance conductive layer from penetrating into the device isolation patterns 112a', 112b', 112c' and 112d'. Furthermore, the auxiliary gate conductive layer 132 may ensure that a subsequently formed resistor will have a sufficient thickness. Moreover, the auxiliary gate conductive layer 132 may ensure that a subsequently formed low-voltage gate electrode will have a sufficient thickness. Nevertheless, formation of the auxiliary gate conductive layer 132 may, in one embodiment, be omitted.

A resistor protection insulating layer 134 may be formed over the substrate 100 and on the auxiliary gate conductive layer 132. The resistor protection insulating layer 134 includes an insulating material having an etch selectivity with respect to the auxiliary gate conductive layer 132. In one embodiment, the resistor protection insulating layer 134 may include an insulating material having a low diffusion coefficient with respect to a metal element.

Figure 10:
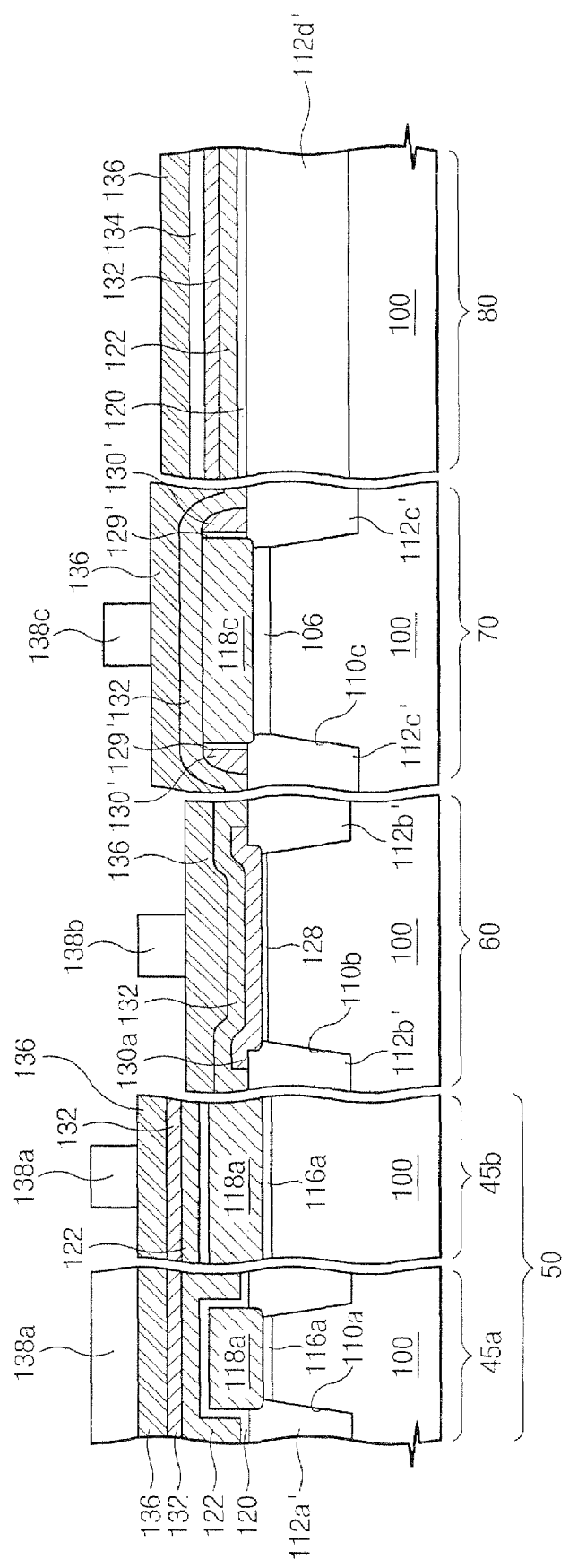

Referring to FIG. 10, portions of the resistor protection insulating layer 134 over the substrate 100 within the cell, low voltage and high voltage regions 50, 60 and 70 are removed to expose the auxiliary gate conductive layer 132, if formed, of the cell, low voltage and high voltage regions 50, 60 and 70. At this time, the resistor protection insulating layer 134 within the resistor region 80 remains.

Subsequently, a low-resistance conductive layer 136 is formed on substantially the entire surface of the substrate 100. The low-resistance conductive layer 136 contacts the exposed auxiliary gate conductive layer 132, if formed. However, the low-resistance conductive layer 136 of the resistor region 80 does not contact the auxiliary gate insulating layer 132 of the resistor region 80 due to the presence of the resistor protection insulating layer 134. Although not illustrated, a capping insulating layer may be formed on the low-resistance conductive layer 136 and include a material such as silicon nitride, silicon oxide, etc.

In one embodiment, the low-resistance conductive layer 136 includes a conductive material having a low resistivity with respect to the control gate conductive layer 122, the low-voltage gate conductive pattern 130a and the auxiliary gate conductive layer 132. For example, the low-resistance conductive layer 136 may include at least one material selected from the group consisting of a metal (e.g., tungsten, molybdenum, etc.), a conductive metal nitride (e.g., titanium nitride, tantalum nitride, etc.), and a metal silicide (e.g., tungsten silicide, cobalt silicide, nickel silicide, titanium silicide, etc.).

In one embodiment, the resistor protection insulating layer 134 additionally has an etch selectivity with respect to the low-resistance conductive layer 136. Accordingly, the resistor protection insulating layer 134 may include a material such as silicon oxide.

A first gate mask pattern 138a, a second gate mask pattern 138b and a third gate mask pattern 138c are formed on the low-resistance conductive layer 136. The first, second and third gate mask patterns 138a, 138b and 138c are formed in the cell, low voltage and high voltage regions 50, 60 and 70, respectively. As illustrated, the low-resistance conductive layer 136 of the resistor region 80 remains exposed. The gate mask patterns 138a, 138b and 138c may include, for example, photoresist patterns.

Referring to FIG. 1, the low-resistance conductive layer 136, the auxiliary gate conductive layer 132, the control gate conductive layer 122, the blocking insulating layer 120 and the first floating gate pattern 118a, which are disposed over the cell region 50, are sequentially patterned using the first gate mask pattern 138a as an etch mask. Accordingly, a floating gate 118a', a blocking insulating pattern 120a and a control gate electrode 140a are sequentially stacked over the substrate 100 within the cell region 50. The low-resistance conductive layer 136, the auxiliary gate conductive layer 132 and the low-voltage gate conductive pattern 130a, which are disposed over the low voltage region 60, are sequentially patterned using the second gate mask pattern 138b as an etch mask so as to form a low-voltage gate electrode 140b over the low voltage region 60. Likewise, the low-resistance conductive layer 136, the auxiliary gate conductive layer 132 and the third floating gate pattern 118c, which are disposed over the high voltage region 70, are sequentially patterned using the third gate mask pattern 138c as an etch mask so as to form a high-voltage gate electrode 140c over the high voltage region 70.

In one embodiment, the etching processes using the respective first, second and third gate mask patterns 138a, 138b and 138c as masks may be simultaneously performed. When performing the etching processes to form the control gate electrode 140a, the low-voltage gate electrode 140b and the high-voltage gate electrode 140c, the exposed low-resistance conductive layer 136 within the resistor region 80 may be removed. At this time, the resistor protection insulating layer 134 of the resistor region 80 protects the auxiliary gate conductive layer 132 and the control gate conductive layer 122 thereunder. In addition, the aforementioned spacers 129' and 130', which may remain over the high voltage region 70, are also removed upon performing the etching processes using the first, second and third gate mask patterns 138a, 138b and 138c as masks.

As illustrated, the control gate electrode 140a crosses over the first active region and the floating gate 118a' is interposed between the control gate electrode 140a and the first active region. The tunnel insulating layer 116a is interposed between the floating gate 118' and the first active region and the blocking insulating pattern 120a is interposed between the floating gate 118a' and the control gate electrode 140a. The control gate electrode 140a includes a first control gate 122a, a second control gate 132a, and a third control gate 136a. Accordingly, the control gate 122a, the second control gate 132a and the third control gate 136a are sequentially stacked over the substrate 100.

As illustrated, the low-voltage gate electrode 140b crosses over the second active region and the low-voltage gate insulating layer 128 is interposed between the low-voltage gate electrode 140b and the second active region. Similarly, the high-voltage gate electrode 140c crosses over the third active region and the high-voltage gate insulating layer 106 is interposed between the high-voltage gate electrode 140c and the third active region.

The low-voltage gate electrode 140b includes a first low-voltage gate 130b, a second low-voltage gate 132b and a third low-voltage gate 136b which are stacked in sequence. The high-voltage gate electrode 140c includes a first high-voltage gate 118c', a second high-voltage gate 132c and a third high-voltage gate 136c which are stacked in sequence.

The first control gate 122a is formed from a portion of the control gate conductive layer 122. The first low-voltage gate 130b is formed from a portion of the low-voltage gate conductive pattern 130a. The first high-voltage gate 118c' is formed from a portion of the third floating gate pattern 118c. Therefore, the first high-voltage gate 118c' is formed of the same material as the floating gate 118a'.

The second control gate 132a, the second low-voltage gate 132b and the second high-voltage gate 132c are formed from portions of the auxiliary gate conductive layer 132. Therefore, the second control gate 132a, the second low-voltage gate 132b and the second high-voltage gate 132c are formed of the same material. The third control gate 136a, the third low-voltage gate 136b and the third high-voltage gate 136c are formed from portions of the low-resistance conductive layer 136. Therefore, the third control gate 136a, the third low-voltage gate 136b and the third high-voltage gate 136c are formed of the same material.

Figure 12:
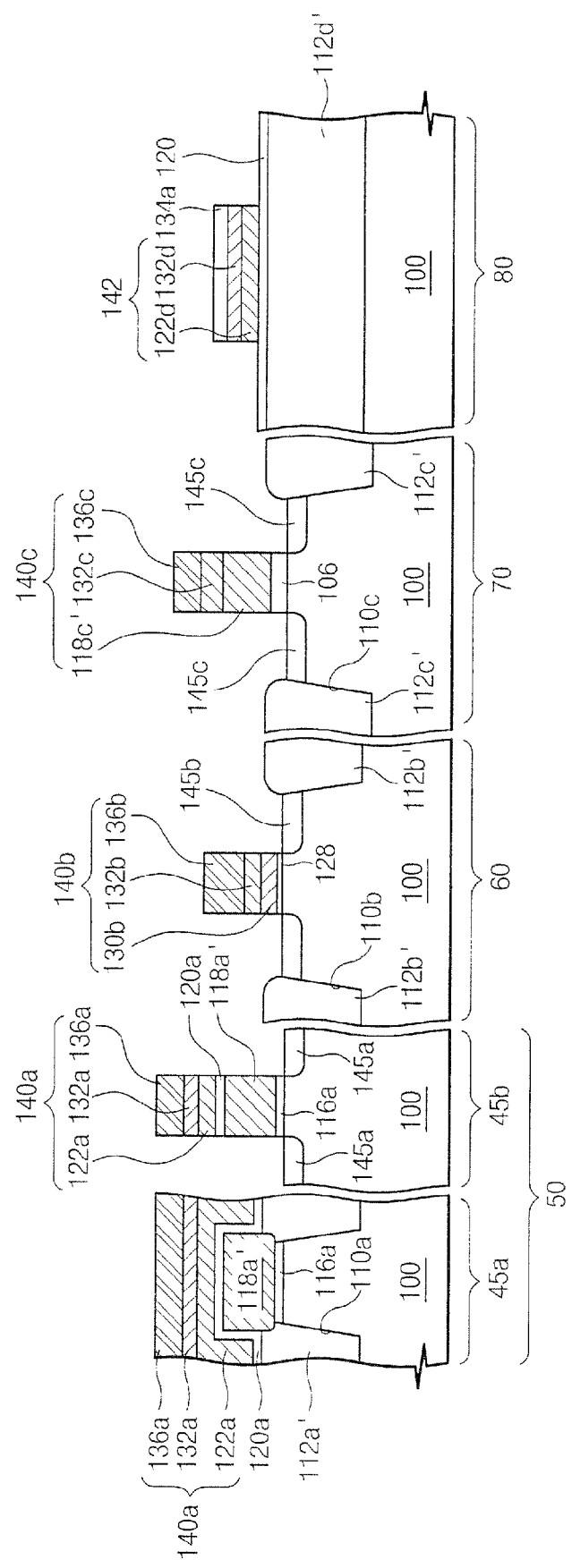

Referring to FIG. 12, the resistor protection insulating layer 134, the auxiliary gate conductive layer 132 and the control gate conductive layer 122 disposed over the resistor region 80 are sequentially patterned, thereby forming a resistor 142 and a resistor protection insulating pattern 134a which are stacked in sequence. The resistor 142 includes a first layer 122d and a second layer 132d which are sequentially stacked. The first layer 122d is formed from a portion of the control gate conductive layer 122 over the resistor region 80 and the second layer 132d is formed from a portion of the auxiliary gate conductive layer 132 over the resistor region 80.

Before forming the resistor 142, dopant ions may be implanted onto the auxiliary gate conductive layer 132 and the control gate conductive layer of the resistor region 80 in order to control the resistance of the resistor 142. The dopant ions may be implanted onto the resistor 142 after forming the resistor 142.

A first dopant region 145a corresponding to source/drain regions of a nonvolatile memory cell may be formed within the first active region 50 at both sides of the control gate electrode 140a. A second dopant region 145b corresponding to source/drain regions of a low-voltage transistor may be formed within the second active region 60 at both sides of the low-voltage gate electrode 140b. A third dopant region 145c corresponding to source/drain regions of a high-voltage transistor may be formed within the third active region 70 at both sides of the high-voltage gate electrode 140c.

In one embodiment, the first, second and third dopant regions 145a, 145b and 145c may be simultaneously formed. In another embodiment, the first, second and third dopant regions 145a, 145b and 145c may be formed sequentially in any order. The first, second and third dopant regions 145a, 145b and 145c may be doped with dopant of the same or different conductivity type.

According to the method of forming the semiconductor device as exemplarily described above, the first floating gate pattern 118a, the blocking insulating layer 120 and the control gate conductive layer 122 over the cell region 50 are formed after forming the tunnel insulating layer 116a. Moreover, the low-voltage gate insulating layer 128 and the low-voltage gate conductive layer 130 are formed after the high-voltage gate insulating layer 106 and the third floating gate pattern 118c over the high-voltage region 70 are formed. Accordingly, the processes involved in forming the low-voltage gate insulating layer 128 and the low-voltage gate conductive layer 130 are not affected by the processes involved in forming the high-voltage gate insulating layer 106, the tunnel insulating layer 116a, the first floating gate pattern 118a, or the blocking insulating layer 120. Accordingly, the method of forming the semiconductor device as exemplarily described above allows the low-voltage gate insulating layer 128 and the low-voltage conductive layer 130 to be independently formed. As a result, the low-voltage gate insulating layer 128 may be formed to sufficiently satisfy characteristics that a low-voltage transistor may uniquely require. For example, the low-voltage gate insulating layer 128 may be formed thinner than the tunnel insulating layer 116a so that it is possible to form the low-voltage transistor with high-speed performance.

In addition, the tunnel insulating layer 116a and the high-voltage gate insulating layer 106 are formed independently of each other and also independently of the low-voltage gate insulating layer 128. Accordingly, the tunnel insulating layer 116a and the high-voltage gate insulating layer 128 may be formed such that they meet the respective optimum characteristics that the nonvolatile memory cell and the high-voltage transistor require.

In view of the embodiments exemplarily described above, it is possible to optimize various characteristics of elements of a semiconductor device that perform different functions.

Further, the high-voltage gate insulating layer 106 never contacts a photoresist layer formed of organic material. Therefore, it is possible to prevent the high-voltage gate insulating layer 106 from becoming contaminated with organic material.

Furthermore, even though the low-resistance conductive layer 136 is formed on substantially the entire surface of the substrate 100, it is possible to prevent the metal contamination of the resistor 142 due to the presence of the resistor protection insulating layer 134.

As described above, the tunnel insulating layer, the low-voltage gate insulating layer and the high-voltage gate insulating layer are formed such that all of these structures have optimized characteristics. In addition, the nonvolatile memory cell, the low-voltage transistor, and the high-voltage transistor including the tunnel insulating layer, the low-voltage gate insulating layer and the high-voltage gate insulating layer, respectively, are formed such that contamination of these structures is minimized. Accordingly, it is possible to form elements performing various functions in the device such that they have the optimized performance characteristics. As a result, it is possible to provide a high-performance semiconductor device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a semiconductor device, the method comprising:

preparing a substrate including a cell region and a low voltage region;

forming a tunnel insulating layer on the cell and low voltage regions;

forming a first charge storage gate pattern and a second charge storage gate pattern on portions of the tunnel insulating layer on the cell and low voltage regions, respectively;

forming a blocking insulating layer and a control gate conductive layer on each of the first and second charge storage gate patterns;

removing a portion of the control gate conductive layer and a portion of the blocking insulating layer on the second charge storage gate pattern and removing the second charge storage gate pattern and the portion of the tunnel insulating layer on the low voltage region, thereby exposing a portion of the low voltage region;

forming a low-voltage gate insulating layer on the exposed portion of the low voltage region; and forming a low-voltage gate conductive pattern on the low-voltage gate insulating layer.

2. The method of claim 1, wherein forming the tunnel insulating layer and the first and second charge storage gate patterns comprises:

forming a hard mask layer on the cell region and on the low voltage region;

patterning the hard mask layer and the substrate to form a first trench and a second trench, respectively, within the substrate, the first trench defining a first active region within the cell region and the second trench defining a second active region within the low voltage region;

forming a first device isolation pattern and a second device isolation pattern within the first and second trenches, respectively;

removing the patterned hard mask layer, thereby forming a first cavity region and a second cavity region exposing the first and second active regions, respectively;

forming the tunnel insulating layer on the exposed first and second active regions; and forming the first and second charge storage gate patterns within the first and second cavity regions, respectively.

3. The method of claim 2, further comprising, before forming the blocking insulating layer, recessing the first and second device isolation patterns, wherein sidewalls of the first and second charge storage gate patterns are exposed by the first and second recessed device isolation patterns, respectively.

4. The method of claim 1, further comprising, before removing the portion of the control gate conductive layer:

forming an etch stop layer on the control gate conductive layer; and selectively removing a portion of the etch stop layer on the low voltage region with respect to a portion of the etch stop layer on the cell region.

5. The method of claim 4, wherein forming the low-voltage gate conductive pattern comprises:

forming a low-voltage gate conductive layer on the cell and low voltage regions;

selectively removing a portion of the low-voltage gate conductive layer on the cell region with respect to a portion of the low-voltage gate conductive layer on the low voltage region; and removing the portion of the etch stop layer on the cell region.

6. The method of claim 1, further comprising:

patterning portions of the control gate conductive layer and the blocking insulating layer on the cell region and patterning the first charge storage gate pattern, thereby forming a control gate electrode, a blocking insulating pattern and a charge storage gate, respectively; and patterning a portion of the low-voltage gate conductive pattern on the low voltage region, thereby forming a low-voltage gate electrode.

7. The method of claim 6, further comprising forming a low-resistance conductive layer on the cell region and on the low voltage region, the low-resistance conductive layer having a resistivity lower than a resistivity of the control gate conductive layer and the low-voltage gate conductive pattern, wherein forming the control gate electrode comprises patterning the portions of the low-resistance conductive layer and the control gate conductive layer on the cell region, and wherein forming the low-voltage gate electrode comprises patterning the portions of the low-resistance conductive layer and the low-voltage gate conductive pattern on the low-voltage region.

8. A method of forming a semiconductor device, the method comprising:

preparing a substrate including a cell region, a low voltage region and a high voltage region;

forming a high-voltage gate insulating layer on the high voltage region;

forming a tunnel insulating layer on the cell and low voltage regions;

forming a first charge storage gate pattern, a second charge storage gate pattern and a third charge storage gate pattern on a portion of the tunnel insulating layer on the cell region, on a portion of the tunnel insulating layer on the low voltage region and on the high-voltage gate insulating layer, respectively;

forming a blocking insulating layer and a control gate conductive layer on each of the first, second and third charge storage gate patterns;

selectively removing portions of the control gate conductive layer and portions of the blocking insulating layer on the low and high voltage regions with respect to portions of the control gate conductive layer and the blocking insulating layer on the cell region;

removing the second charge storage gate pattern and the portion of the tunnel insulating layer on the low voltage region, thereby exposing a portion of the low voltage region;

forming a low voltage gate insulating layer on the exposed portion of the low voltage region; and forming a low-voltage gate conductive pattern on the low-voltage gate insulating layer.

9. The method of claim 8, wherein forming the high-voltage gate insulating layer, the tunnel insulating layer, and the first, second and third charge storage gate patterns comprises:

selectively forming a buffer insulating layer and an anti-oxidation layer on the cell and low voltage regions, wherein the high voltage region is exposed by the buffer insulating layer and the anti-oxidation layer;

forming the high-voltage gate insulating layer on the exposed high voltage region;

removing the anti-oxidation layer;

forming a hard mask layer on the buffer insulating layer;

patterning portions of the hard mask layer and the buffer insulating layer on the cell and low voltage regions and the substrate to form a first trench and a second trench, respectively, within the substrate, the first trench defining a first active region within with the cell region and the second trench defining a second active region within the low voltage region;

patterning portions of the hard mask layer and the high-voltage gate insulating layer on the high voltage region and the substrate to form a third trench within the substrate, the third trench defining and a third active region within the high voltage region;

forming a first device isolation pattern, a second device isolation pattern and a third device isolation pattern within the first, second and third trenches, respectively;

removing the portions of the patterned hard mask layer and the buffer insulating layer on the cell and low voltage regions, thereby forming a first cavity region and a second cavity region exposing the first and second active regions, respectively;

removing the portion of the patterned hard mask layer on the high voltage region, thereby forming a third cavity region exposing the high-voltage gate insulating layer;

forming the tunnel insulating layer on the exposed first and second active regions; and forming the first, second and third charge storage gate patterns filling the first, second and third cavity regions, respectively.

10. The method of claim 9, further comprising, before forming the blocking insulating layer, recessing the first, second and third device isolation patterns, wherein sidewalls of the first, second and third charge storage gate patterns are exposed by the first, second and third recessed device isolation patterns, respectively.

11. The method of claim 8, further comprising, before selectively removing portions of the control gate conductive layer:

forming an etch stop layer on the control gate conductive layer; and selectively removing portions of the etch stop layer on the low and high voltage regions with respect to a portion of the etch stop layer on the cell region.

12. The method of claim 11, wherein forming of the low-voltage gate conductive pattern comprises:

forming a low-voltage gate conductive layer on the cell and low voltage regions and on the third charge storage gate pattern;

selectively removing a portion of the low-voltage gate conductive layer on the cell region and at least a portion of the low-voltage gate conductive layer on the third charge storage gate pattern with respect to a portion of the low-voltage gate conductive layer on the low voltage region; and removing the portion of the etch stop layer on the cell region.

13. The method of claim 8, further comprising:

patterning portions of the control gate conductive layer and the blocking insulating layer on the cell region and patterning the first charge storage gate pattern, thereby forming a control gate electrode, a blocking insulating pattern and a charge storage gate, respectively;

patterning the low-voltage gate conductive pattern, thereby forming a low-voltage gate electrode; and patterning the third charge storage gate pattern, thereby forming a high-voltage gate electrode.

14. The method of claim 13, further comprising forming a low-resistance conductive layer on the cell, low voltage and high voltage regions, the low-resistance conductive layer having a resistivity lower than a resistivity of the control gate conductive layer, the low-voltage gate conductive pattern and the third charge storage gate pattern, wherein forming the control gate electrode comprises patterning portions of the low-resistance conductive layer and the control gate conductive layer on the cell region, wherein forming the low-voltage gate electrode comprises patterning portions of the low-resistance conductive layer and the low-voltage gate conductive pattern on the low-voltage region, and wherein forming the high-voltage gate electrode comprises patterning portions of the low-resistance conductive layer and the third charge storage gate pattern on the high-voltage region.

15. The method of claim 14, further comprising, before forming the low resistance conductive layer, forming an auxiliary gate conductive layer on the cell, low voltage and high voltage regions, wherein forming the control gate electrode comprises patterning portions of the low-resistance conductive layer, the auxiliary gate conductive layer, and the control gate conductive layer on the cell region, wherein forming the low voltage gate electrode comprises patterning portions of the low-resistance conductive layer, the auxiliary gate conductive layer and the low-voltage gate conductive pattern on the low voltage region, and wherein forming the high-voltage gate electrode comprises patterning portions of the low-resistance conductive layer, the auxiliary gate conductive layer and the third charge storage gate pattern on the high-voltage region.

16. A method of forming a semiconductor device, the method comprising:

preparing a substrate including a cell region, a low voltage region, a high voltage region and a resistor region;

forming a high-voltage gate insulating layer on the high voltage region;

forming a tunnel insulating layer on the cell and low voltage regions;

forming a first charge storage gate pattern, a second charge storage gate pattern and a third charge storage gate pattern on a portion of the tunnel insulating layer on the cell region, on a portion of the tunnel insulating layer on the low voltage region and on the high-voltage gate insulating layer, respectively;

forming a blocking insulating layer and a control gate conductive layer on each of the first, second and third charge storage gate patterns and on the resistor region;

selectively removing portions of the control gate conductive layer and the blocking insulating layer on the low and high voltage regions with respect to portions of the control gate conductive layer and the blocking insulating layer on the cell region;

removing the second charge storage gate pattern and the portion of the tunnel insulating layer on the low voltage region, thereby exposing a portion of the low voltage region;

forming a low voltage gate insulating layer on the exposed portion of the low voltage region; and forming a low-voltage gate conductive pattern on the low-voltage gate insulating layer.

17. The method of claim 16, wherein forming the high-voltage gate insulating layer, the tunnel insulating layer and the first, second and third charge storage gate patterns comprises:

selectively forming a buffer insulating layer and an anti-oxidation layer on the cell, low voltage and resistor regions, wherein the high voltage region is exposed by the buffer insulating layer and the anti-oxidation layer;

forming the high-voltage gate insulating layer on the exposed high voltage region;

removing the anti-oxidation layer;

forming a hard mask layer on the buffer insulating layer;

patterning portions of the hard mask layer and the buffer insulating layer on the cell and low voltage regions and the substrate to form a first trench and a second trench, respectively, within the substrate, the first trench defining a first active region within with the cell region and the second trench defining a second active region within the low voltage region;

patterning portions of the hard mask layer and the high-voltage gate insulating layer on the high voltage region and the substrate to form a third trench within the substrate, the third trench defining and a third active region within the high voltage region;

patterning portions of the hard mask layer and the buffer insulating layer on the resistor region and the substrate to form a fourth trench within the resistor region;

forming a first device isolation pattern, a second device isolation pattern, a third device isolation pattern and a fourth device isolation pattern within the first, second, third and fourth trenches, respectively;

removing the portions of the patterned hard mask layer and the buffer insulating layer on the cell and low voltage regions, thereby forming a first cavity region and a second cavity region exposing the first and second active regions, respectively;

removing the portion of the patterned hard mask layer on the high voltage region, thereby forming a third a third cavity region exposing the high-voltage gate insulating layer;

forming the tunnel insulating layer on the exposed first and second active regions; and forming the first, second and third charge storage gate patterns within the first, second and third cavity regions, respectively.

18. The method of claim 17, further comprising, before forming the blocking insulating layer, recessing the first, second, third and fourth device isolation patterns, wherein sidewalls of the first, second and third charge storage gate patterns are exposed by the first, second and third recessed device isolation patterns, respectively.

19. The method of claim 16, further comprising, before selectively removing portions of the control gate conductive layer:
forming an etch stop layer on the control gate conductive layer; and
selectively removing portions of the etch stop layer on the low and high voltage regions with respect to portions of the etch stop layer on the cell and resistor regions.

20. The method of claim 19, wherein forming the low-voltage gate conductive pattern comprises:
forming a low-voltage gate conductive layer on the cell, low voltage and resistor regions and on the third charge storage gate pattern;
selectively removing a portion of the low-voltage gate conductive layer on the cell and resistor regions and at least a portion of the low-voltage gate conductive layer on the first charge storage gate pattern with respect to a portion of the low-voltage gate conductive layer on the low voltage region; and
removing the portion of the etch stop layer on the cell and resistor regions.

21. The method of claim 16, further comprising:
patterning portions of the control gate conductive layer, the blocking insulating layer and the first charge storage gate pattern on the cell region, thereby forming a control gate electrode, a blocking insulating pattern and a charge storage gate, respectively;
patterning the low-voltage gate conductive pattern, thereby forming a low-voltage gate electrode;
patterning the third charge storage gate pattern, thereby forming a high-voltage gate electrode; and
patterning a portion of the control gate conductive layer on the resistor region, thereby forming a resistor.

22. The method of claim 21, further comprising:
forming a resistor protection insulating layer on the cell, low voltage, high voltage and resistor regions;
selectively removing portions of the resistor protection insulating layer on the cell, low voltage and high voltage regions with respect to a portion of the resistor protection insulating layer on the resistor region; and
forming a low-resistance conductive layer on the cell, low voltage, high voltage and resistor regions, wherein a resistivity of the low-resistance conductive layer is a lower than a resistivity of the control gate conductive layer, the low-voltage gate conductive pattern and the third charge storage gate pattern,
wherein forming the control gate electrode comprises patterning portions of the low-resistance conductive layer and the control gate conductive layer on the cell region,
wherein forming the low-voltage gate electrode comprises patterning portions of the low-resistance conductive layer and the low-voltage gate conductive pattern on the low-voltage region,
wherein forming the high-voltage gate electrode comprises patterning portions of the low-resistance conductive layer and the third charge storage gate pattern on the high-voltage region, and
wherein forming the resistor comprises patterning the low-resistance conductive layer on the resistor region during at least one of forming the control gate electrode, the low-voltage gate electrode and the high-voltage gate electrode.

23. The method of claim 22, further comprising, before forming the resistor protection insulating layer, forming an auxiliary gate conductive layer on the cell, low voltage, high voltage and resistor regions,
wherein forming the control gate electrode comprises patterning portions of the low-resistance conductive layer, the auxiliary gate conductive layer, and the control gate conductive layer on the cell region,
wherein forming the low voltage gate electrode comprises patterning portions of the low-resistance conductive layer, the auxiliary gate conductive layer and the low voltage gate conductive pattern on the low voltage region,
wherein forming the high-voltage gate electrode comprises patterning portions of the low-resistance conductive layer, the auxiliary gate conductive layer and the third charge storage gate pattern on the high voltage region, and
wherein forming the resistor comprises patterning portions of the auxiliary gate conductive layer and the control gate conductive layer on the resistor region.

* * * * *

UNITED STATES PATENT AND TRADEMARK OFFICE
CERTIFICATE OF CORRECTION

PATENT NO. : 7,608,500 B2
APPLICATION NO. : 11/671994
DATED : October 27, 2009
INVENTOR(S) : You et al.

Figure 11:
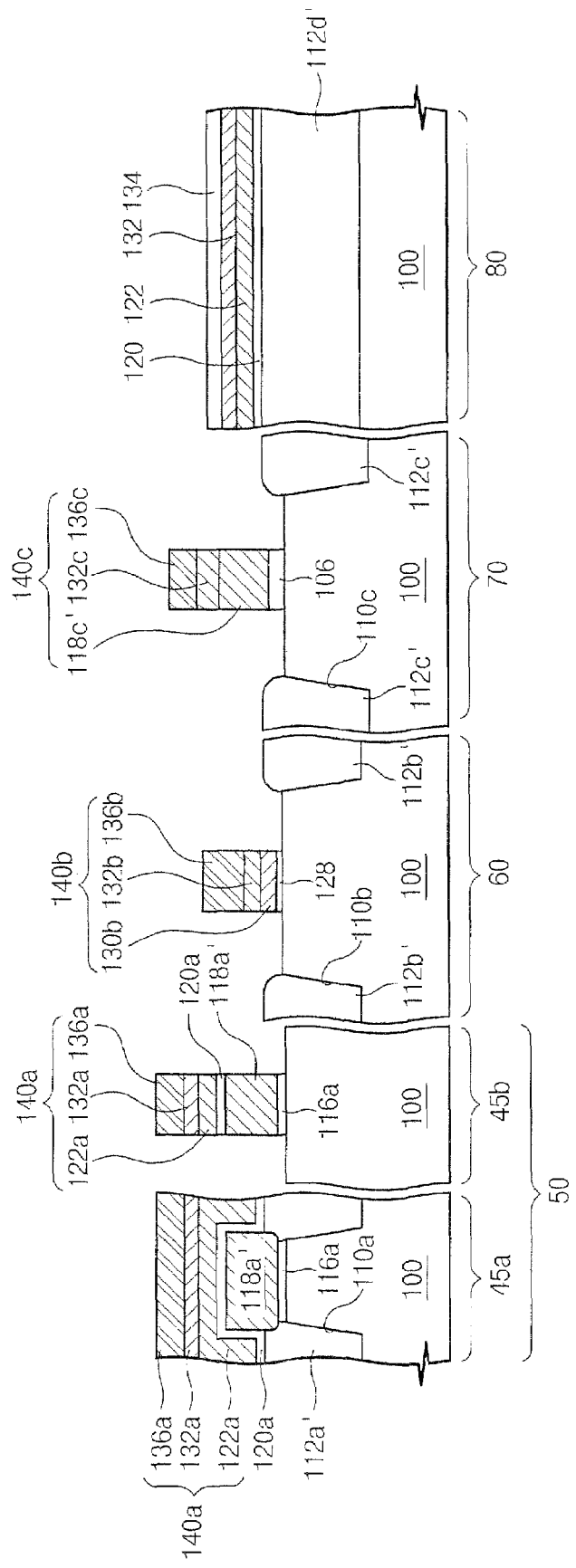

It is certified that error appears in the above-identified patent and that said Letters Patent is hereby corrected as shown below:

Column 9, line 37, the word "FIG. 1," should read -- FIG. 11, --.

Signed and Sealed this

Sixteenth Day of March, 2010

David J. Kappos
*Director of the United States Patent and Trademark Office*